United States Patent
Hirose

(10) Patent No.: US 9,548,133 B2
(45) Date of Patent: Jan. 17, 2017

(54) SHIFT REGISTER CIRCUIT

(71) Applicant: Semiconductor Energy Laboratory Co., Ltd., Atsugi-shi, Kanagawa-ken (JP)

(72) Inventor: Atsushi Hirose, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 107 days.

(21) Appl. No.: 14/293,084

(22) Filed: Jun. 2, 2014

(65) Prior Publication Data

US 2014/0266304 A1   Sep. 18, 2014

Related U.S. Application Data

(63) Continuation of application No. 13/628,437, filed on Sep. 27, 2012, now Pat. No. 8,744,038.

(30) Foreign Application Priority Data

Sep. 28, 2011 (JP) ................. 2011-212048

(51) Int. Cl.
*G11C 19/00* (2006.01)
*G11C 19/28* (2006.01)

(52) U.S. Cl.
CPC .................. *G11C 19/28* (2013.01)

(58) Field of Classification Search
CPC ............. G09G 2310/0286; G09G 3/3677; G11C 19/184; G11C 19/00
USPC .... 377/64, 74, 68, 73, 78, 79; 327/108, 112; 326/95, 98
See application file for complete search history.

(56) References Cited

U.S. PATENT DOCUMENTS

| | | |
|---|---|---|
| 4,615,102 A | 10/1986 | Suzuki et al. |
| 5,338,959 A | 8/1994 | Kim et al. |
| 5,731,856 A | 3/1998 | Kim et al. |
| 5,744,823 A | 4/1998 | Harkin et al. |

(Continued)

FOREIGN PATENT DOCUMENTS

| | | |
|---|---|---|
| EP | 1737044 A | 12/2006 |
| EP | 1770788 A | 4/2007 |

(Continued)

OTHER PUBLICATIONS

Cho.Y et al., "Characteristics of a-Si:H Dual-Gate TFTs Using ITO Electrode for LCD Driver", AM-FPD '08 Digest of Technical Papers, Jul. 2, 2008, pp. 229-232.

(Continued)

*Primary Examiner* — Quan Tra
(74) *Attorney, Agent, or Firm* — Fish & Richardson P.C.

(57) ABSTRACT

A shift register circuit including a logic circuit capable of controlling the threshold voltage of a transistor and outputting a signal corresponding to an input signal by changing only the potential of a back gate without changing the potential of a gate is provided. In a shift register circuit including a logic circuit with a first transistor and a second transistor having the same conductivity type, a first gate electrode of the first transistor is connected to a source electrode or a drain electrode of the first transistor, an input signal is supplied to a second gate electrode of the first transistor, a clock signal is supplied to a gate electrode of the second transistor, and the first gate electrode and the gate electrode are formed from the same layer.

27 Claims, 9 Drawing Sheets

(56) References Cited

U.S. PATENT DOCUMENTS

| | | | |
|---|---|---|---|
| 5,744,864 | A | 4/1998 | Cillessen et al. |
| 5,847,410 | A | 12/1998 | Nakajima |
| 6,215,840 | B1 | 4/2001 | Malaviya et al. |
| 6,294,274 | B1 | 9/2001 | Kawazoe et al. |
| 6,462,723 | B1 | 10/2002 | Yamazaki et al. |
| 6,563,174 | B2 | 5/2003 | Kawasaki et al. |
| 6,586,346 | B1 | 7/2003 | Yamazaki et al. |
| 6,603,453 | B2 | 8/2003 | Yamazaki et al. |
| 6,727,522 | B1 | 4/2004 | Kawasaki et al. |
| 6,788,567 | B2 | 9/2004 | Fujimori |
| 6,960,787 | B2 | 11/2005 | Yamazaki et al. |
| 6,960,812 | B2 | 11/2005 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,067,843 | B2 | 6/2006 | Carcia et al. |
| 7,105,868 | B2 | 9/2006 | Nause et al. |
| 7,145,174 | B2 | 12/2006 | Chiang et al. |
| 7,180,135 | B1 * | 2/2007 | Ioannou et al. ............... 257/347 |
| 7,202,863 | B2 | 4/2007 | Kimura et al. |
| 7,211,825 | B2 | 5/2007 | Shih et al. |
| 7,247,882 | B2 | 7/2007 | Yamazaki et al. |
| 7,262,463 | B2 | 8/2007 | Hoffman |
| 7,282,782 | B2 | 10/2007 | Hoffman et al. |
| 7,297,977 | B2 | 11/2007 | Hoffman et al. |
| 7,298,084 | B2 | 11/2007 | Baude et al. |
| 7,298,176 | B2 | 11/2007 | Ngo et al. |
| 7,301,211 | B2 | 11/2007 | Yamazaki et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,470,607 | B2 | 12/2008 | Carcia et al. |
| 7,491,987 | B2 | 2/2009 | Genrikh et al. |
| 7,501,293 | B2 | 3/2009 | Ito et al. |
| 7,507,618 | B2 | 3/2009 | Dunbar |
| 7,544,967 | B2 | 6/2009 | Kim et al. |
| 7,566,904 | B2 | 7/2009 | Ishii |
| 7,575,966 | B2 | 8/2009 | Lai et al. |
| 7,576,394 | B2 | 8/2009 | Furuta et al. |
| 7,601,984 | B2 | 10/2009 | Sano et al. |
| 7,608,531 | B2 | 10/2009 | Isa et al. |
| 7,622,371 | B2 | 11/2009 | Pan et al. |
| 7,635,889 | B2 | 12/2009 | Isa et al. |
| 7,645,478 | B2 | 1/2010 | Thelss et al. |
| 7,663,302 | B2 | 2/2010 | Shin et al. |
| 7,674,650 | B2 | 3/2010 | Akimoto et al. |
| 7,687,807 | B2 | 3/2010 | Koo et al. |
| 7,691,666 | B2 | 4/2010 | Levy et al. |
| 7,732,251 | B2 | 6/2010 | Hoffman et al. |
| 7,732,819 | B2 | 6/2010 | Akimoto et al. |
| 7,733,015 | B2 | 6/2010 | Saito |
| 7,767,106 | B2 | 8/2010 | Chang |
| 7,772,021 | B2 | 8/2010 | Lee et al. |
| 7,786,985 | B2 | 8/2010 | Kimura et al. |
| 7,791,072 | B2 | 9/2010 | Kumomi et al. |
| 7,791,082 | B2 | 9/2010 | Iwasaki |
| 7,795,613 | B2 | 9/2010 | Ito et al. |
| 7,829,444 | B2 | 11/2010 | Yabuta et al. |
| 7,863,611 | B2 | 1/2011 | Abe et al. |
| 7,867,636 | B2 | 1/2011 | Nakagawara et al. |
| 7,868,326 | B2 | 1/2011 | Sano et al. |
| 7,872,259 | B2 | 1/2011 | Den et al. |
| 7,884,360 | B2 | 2/2011 | Takechi et al. |
| 7,923,722 | B2 | 4/2011 | Ryu et al. |
| 7,932,521 | B2 | 4/2011 | Akimoto et al. |
| 7,935,641 | B2 | 5/2011 | Kim et al. |
| 7,939,822 | B2 | 5/2011 | Maekawa et al. |
| 7,940,085 | B2 | 5/2011 | Kim et al. |
| 8,044,906 | B2 | 10/2011 | Kimura et al. |
| 8,059,078 | B2 | 11/2011 | Kimura et al. |
| 8,067,775 | B2 | 11/2011 | Miyairi et al. |
| 8,106,400 | B2 | 1/2012 | Miyairi et al. |
| 8,193,031 | B2 | 6/2012 | Hosoba et al. |
| 8,217,680 | B2 | 7/2012 | Kim et al. |
| 8,243,873 | B2 * | 8/2012 | Koyama et al. ................. 377/78 |
| 8,305,109 | B2 * | 11/2012 | Okazaki et al. ................. 326/25 |
| 8,592,251 | B2 | 11/2013 | Hosoba et al. |
| 8,605,027 | B2 | 12/2013 | Pak et al. |
| 8,674,979 | B2 | 3/2014 | Hayakawa |
| 9,093,262 | B2 | 7/2015 | Hosoba et al. |
| 2001/0015657 | A1 | 8/2001 | Ye |
| 2001/0030323 | A1 | 10/2001 | Ikeda |
| 2001/0046027 | A1 | 11/2001 | Tai et al. |
| 2002/0043662 | A1 | 4/2002 | Yamazaki et al. |
| 2002/0044111 | A1 | 4/2002 | Yamazaki et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0051823 | A1 | 3/2004 | Choi |
| 2004/0090279 | A1 | 5/2004 | Seki |
| 2004/0127038 | A1 | 7/2004 | Carcia et al. |
| 2004/0184027 | A1 | 9/2004 | Mizutani et al. |
| 2005/0017302 | A1 | 1/2005 | Hoffman |
| 2005/0162579 | A1 | 7/2005 | Jeong et al. |
| 2005/0199959 | A1 | 9/2005 | Chiang et al. |
| 2005/0199960 | A1 | 9/2005 | Hoffman et al. |
| 2005/0275038 | A1 | 12/2005 | Shih et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292726 | A1 | 12/2006 | Akimoto et al. |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0096816 | A1 | 5/2007 | Paul et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0042217 | A1 | 2/2008 | Jeong et al. |
| 2008/0050595 | A1 | 2/2008 | Nakagawara et al. |
| 2008/0073653 | A1 | 3/2008 | Iwasaki |
| 2008/0080221 | A1 | 4/2008 | Koo et al. |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |

(56) References Cited

U.S. PATENT DOCUMENTS

| | | |
|---|---|---|
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0033818 A1 | 2/2009 | Nakajima et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0091678 A1 | 4/2009 | Jeong et al. |
| 2009/0114910 A1 | 5/2009 | Chang |
| 2009/0128476 A1 | 5/2009 | Lee et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0051937 A1 | 3/2010 | Kaji et al. |
| 2010/0065844 A1 | 3/2010 | Tokunaga |
| 2010/0079169 A1* | 4/2010 | Kim et al. .............. 326/120 |
| 2010/0084650 A1 | 4/2010 | Yamazaki et al. |
| 2010/0084651 A1 | 4/2010 | Yamazaki et al. |
| 2010/0085081 A1* | 4/2010 | Ofuji et al. .............. 326/102 |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0117079 A1 | 5/2010 | Miyairi et al. |
| 2010/0171689 A1 | 7/2010 | Jeong |
| 2010/0252826 A1 | 10/2010 | Yamazaki et al. |
| 2010/0301326 A1 | 12/2010 | Miyairi et al. |
| 2011/0062432 A1 | 3/2011 | Yamazaki et al. |
| 2011/0221475 A1 | 9/2011 | Koyama et al. |
| 2012/0032943 A1 | 2/2012 | Kimura et al. |
| 2012/0061668 A1 | 3/2012 | Miyairi et al. |
| 2012/0104386 A1 | 5/2012 | Miyairi et al. |
| 2016/0020330 A1 | 1/2016 | Hosoba et al. |

FOREIGN PATENT DOCUMENTS

| | | |
|---|---|---|
| EP | 2172972 A | 4/2010 |
| EP | 2226847 A | 9/2010 |
| JP | 60-198861 A | 10/1985 |
| JP | 62-502370 | 9/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-301565 A | 12/1988 |
| JP | 02-156676 A | 6/1990 |
| JP | 03-231472 A | 10/1991 |
| JP | 05-251705 A | 9/1993 |
| JP | 06-202156 A | 7/1994 |
| JP | 08-264794 A | 10/1996 |
| JP | 10-290012 A | 10/1998 |
| JP | 11-505377 | 5/1999 |
| JP | 2000-044236 A | 2/2000 |
| JP | 2000-150900 A | 5/2000 |
| JP | 2001-051292 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-273228 A | 9/2003 |
| JP | 2003-280034 A | 10/2003 |
| JP | 2003-309266 A | 10/2003 |
| JP | 2004-103957 A | 4/2004 |
| JP | 2004-104565 A | 4/2004 |
| JP | 2004-222256 A | 8/2004 |
| JP | 2004-273614 A | 9/2004 |
| JP | 2004-273732 A | 9/2004 |
| JP | 2005-051228 A | 2/2005 |
| JP | 2005-164802 A | 6/2005 |
| JP | 2006-203241 A | 8/2006 |
| JP | 2006-237624 A | 9/2006 |
| JP | 2007-096055 A | 4/2007 |
| JP | 2007-123861 A | 5/2007 |
| JP | 2007-150158 A | 6/2007 |
| JP | 2007-250983 A | 9/2007 |
| JP | 2007-529119 | 10/2007 |
| JP | 2010-087518 A | 4/2010 |
| JP | 2011-086927 A | 4/2011 |
| JP | 2011-086929 A | 4/2011 |
| JP | 2011-120221 A | 6/2011 |
| JP | 2011-129895 A | 6/2011 |
| TW | 200617834 | 6/2006 |
| TW | I259471 | 8/2006 |
| TW | I322975 | 4/2010 |
| WO | WO-86/05935 | 10/1986 |
| WO | WO-2004/114391 | 12/2004 |
| WO | WO-2005/093850 | 10/2005 |
| WO | WO-2007/119386 | 10/2007 |
| WO | WO-2008/105250 | 9/2008 |
| WO | WO-2008/143304 | 11/2008 |
| WO | WO-2011/033911 | 3/2011 |
| WO | WO-2011/034012 | 3/2011 |
| WO | WO-2011/052368 | 5/2011 |

OTHER PUBLICATIONS

Takahashi.K et al., "4p-N-10 Back-channel control in amorphous In—Ga—Zn—O TFTs", 69th Japan Society of Applied Physics, Sep. 1, 2008, No. 2, p. 851.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", App. Phys. Lett. (Applied Physics), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg—Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn]at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m =3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID

(56) References Cited

OTHER PUBLICATIONS

Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vaccum Science & Technology B) Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters),Jul. 31, 2000, vol. 85, No. 5, pp. 1012-1015.

Taiwanese Office Action (Application No. 101135572) Dated Jul. 15, 2016.

\* cited by examiner

US 9,548,133 B2

SHIFT REGISTER CIRCUIT

CROSS-REFERENCE TO RELATED APPLICATIONS

This application is a continuation of U.S. application Ser. No. 13/628,437, filed Sep. 27, 2012, now allowed, which claims the benefit of a foreign priority application filed in Japan as Serial No. 2011-212048 on Sep. 28, 2011, both of which are incorporated by reference.

BACKGROUND OF THE INVENTION

1. Field of the Invention

The present invention relates to a shift register circuit. Further, the present invention relates to a display device in which a shift register circuit is formed over the same substrate as a pixel portion. Furthermore, the present invention relates to an electronic device including the display device.

2. Description of the Related Art

Display devices such as liquid crystal televisions are required to be manufactured at lower cost so as to be more widely used, so that development thereof have been conducted. In particular, a technique in which a driver circuit such as a scan line driver circuit is formed using a thin film transistor (TFT) over the same substrate as a pixel portion has been actively developed.

As an example of a driver circuit that can be formed over the same substrate as a pixel portion, there is a driver circuit having a configuration in which transistors having the same conductivity type (one conductivity type) are used in combination (for example, see Patent Document 1).

REFERENCE

Patent Document

[Patent Document 1] Japanese Published Patent Application No. 2005-164802

SUMMARY OF THE INVENTION

In a driver circuit including transistors having one conductivity type, a doping step or the like in a manufacturing process of the transistors can be skipped unlike in the case of a driver circuit in which transistors having different conductivity types are used in combination; therefore, manufacturing cost can be made lower.

When a driver circuit in which transistors having different conductivity types are used in combination is formed, the layout of a p-channel transistor and that of an n-channel transistor need to be different because the mobility of the p-channel transistor and that of the n-channel transistor are different. As a result, there is a problem in that the layout area is increased. By forming a driver circuit including transistors having one conductivity type and thus having the same mobility, the layout area can be reduced.

On the other hand, when a driver circuit including transistors having the same conductivity type is formed, there is a problem in that both a depletion transistor (also referred to as normally-on transistor) and an enhancement transistor (also referred to as normally-off transistor) are provided due to a shift in threshold voltage of the transistors. Since a normally-on transistor is provided, through current in the circuit is increased; thus, power consumption is increased. Therefore, a structure by which a shift in threshold voltage of the transistors is prevented needs to be provided.

In order to control the threshold voltage, a back gate electrode (second gate electrode) is provided in addition to a gate electrode (first gate electrode) in a transistor, and the potential of the back gate electrode is made to switch between two values; accordingly, the transistor can be made to switch between a normally-on state and a normally-off state. However, in the case where a signal is input to the gate electrode while the potential of the back gate electrode is made to switch between two values, both the potential of the gate electrode and that of the back gate electrode are made to switch between two values, and thus power consumption is increased.

In view of this, an object of one embodiment of the present invention is to provide a shift register circuit including a logic circuit capable of controlling the threshold voltage of a transistor and outputting a signal corresponding to an input signal by changing only the potential of a back gate electrode without changing the potential of a gate electrode.

According to one embodiment of the present invention, in a shift register circuit including a logic circuit with a first transistor and a second transistor having the same conductivity type, a first gate electrode of the first transistor is connected to a source electrode or a drain electrode of the first transistor, an input signal is supplied to a second gate electrode of the first transistor, a clock signal is supplied to a gate electrode of the second transistor, and the first gate electrode and the gate electrode of the second transistor are formed from the same layer.

One embodiment of the present invention is a shift register circuit including a logic circuit including a first transistor and a second transistor which have the same conductivity type. A first gate electrode of the first transistor is electrically connected to a source electrode or a drain electrode of the first transistor. A second gate electrode of the first transistor is electrically connected to a wiring to which an input signal is supplied. A gate electrode of the second transistor is electrically connected to a wiring to which a clock signal is supplied. The first gate electrode and the gate electrode of the second transistor are formed from the same layer.

Another embodiment of the present invention is a shift register circuit including a logic circuit including a first transistor and a second transistor which have the same conductivity type. The first transistor includes a first gate electrode; a first semiconductor film over the first gate electrode; and a second gate electrode over the first semiconductor film. The first gate electrode is electrically connected to a source electrode or a drain electrode of the first transistor. The second gate electrode of the first transistor is electrically connected to a wiring to which an input signal is supplied. The second transistor includes a gate electrode; and a second semiconductor film over the gate electrode. The gate electrode of the second transistor is electrically connected to a wiring to which a clock signal is supplied. The first gate electrode and the gate electrode of the second transistor are formed from the same layer.

Another embodiment of the present invention is a shift register circuit including a logic circuit including a first transistor and a second transistor which have the same conductivity type. The first transistor includes a first gate electrode; a gate insulating film over the first gate electrode; a first semiconductor film over the gate insulating film; a source electrode and a drain electrode over the first semiconductor film; an interlayer insulating film over the source electrode and the drain electrode; and a second gate electrode over the interlayer insulating film. The first gate electrode is electrically connected to the source electrode or the drain electrode. The second gate electrode of the first transistor is electrically connected to a wiring to which an input signal is supplied. The second transistor includes a gate electrode; the gate insulating film over the gate electrode; and a second semiconductor film over the gate insulating film. The gate electrode of the second transistor is electrically connected to a wiring to which a clock signal is supplied. The first gate electrode and the gate electrode of the second transistor are formed from the same layer.

In the above embodiment, the thickness of the gate insulating film is preferably smaller than that of the interlayer insulating film in the shift register circuit.

In the above embodiment, the first semiconductor film and the second semiconductor film are preferably formed from the same layer in the shift register circuit.

In the above embodiment, the first transistor and the second transistor are preferably n-channel transistors in the shift register circuit.

According to one embodiment of the present invention, a shift register circuit including a logic circuit capable of controlling the threshold voltage of a transistor and outputting a signal corresponding to an input signal by changing only the potential of a back gate electrode without changing the potential of a gate electrode can be provided.

DETAILED DESCRIPTION OF THE INVENTION

Figure 1A:
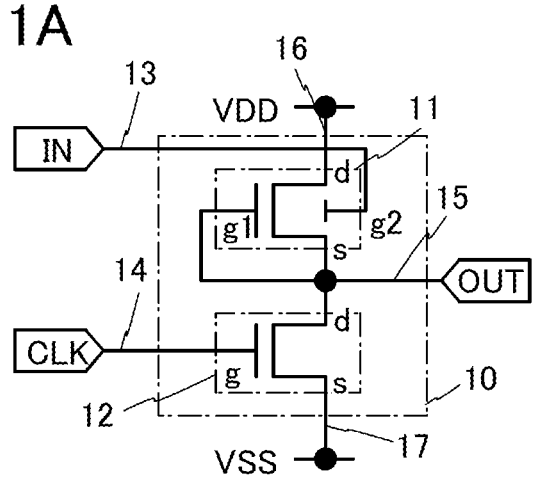
FIGS. 1A to 1C illustrate a structure according to Embodiment 1.

Hereinafter, embodiments of the present invention will be described with reference to the accompanying drawings. Note that the present invention can be carried out in many different modes, and it is easily understood by those skilled in the art that modes and details of the present invention can be modified in various ways without departing from the spirit and the scope of the present invention. Therefore, the present invention should not be construed as being limited to the following description of the embodiments. Note that in the structures of the present invention described below, reference numerals denoting the same portions are used in common in different drawings.

Note that the size, the thickness of a layer, and a region in structures illustrated in the drawings and the like in the embodiments are exaggerated for simplicity in some cases. Therefore, the scale is not necessarily limited to that illustrated in the drawings.

Note that in this specification, terms such as "first", "second", "third", and "N-th" (N is a natural number of 2 or larger) are used in order to avoid confusion between components and thus do not limit the components numerically.

Embodiment 1

First, a configuration of a logic circuit which is provided in a shift register circuit and includes a first transistor and a second transistor will be described.

A logic circuit 10 illustrated in FIG. 1A includes a first transistor 11 and a second transistor 12.

Although each of the first transistor 11 and the second transistor 12 is described in this embodiment as being an n-channel transistor, each of the first transistor 11 and the second transistor 12 may be a p-channel transistor.

In the first transistor 11 of FIG. 1A, a first gate electrode, a source electrode, a drain electrode, and a second gate electrode are illustrated with shortened names, g1, s, d, and g2, respectively. The first gate electrode of the first transistor 11 is connected to the source electrode of the first transistor 11. The second gate electrode of the first transistor 11 is connected to a wiring 13. The drain electrode of the first transistor 11 is connected to a wiring 16.

In the second transistor 12 of FIG. 1A, a gate electrode, a source electrode, and a drain electrode are illustrated with shortened names, g, s, and d, respectively. The gate electrode of the second transistor 12 is connected to a wiring 14. The drain electrode of the second transistor 12 is connected to the source electrode of the first transistor 11 and a wiring 15. The source electrode of the second transistor 12 is connected to a wiring 17.

Note that since the source electrode and the drain electrode of the transistor may be switched depending on the structure, the operating condition, or the like of the transistor, it is difficult to define which is a source electrode or a drain electrode in some cases. Therefore, one of the source electrode and the drain electrode may also be referred to as a first electrode and the other may also be referred to as a second electrode.

The wiring 16 is a wiring to which a high power supply potential VDD is supplied. The wiring 17 is a wiring to which a low power supply potential VSS is supplied. The wiring 13 is a wiring to which an input signal IN is supplied. The wiring 14 is a wiring to which a clock signal CLK is supplied. The wiring 15 is a wiring from which an output signal OUT is output.

The input signal IN supplied to the wiring 13 is, for example, a start pulse in the shift register circuit or a signal output from a circuit in the preceding stage. The clock signal CLK supplied to the wiring 14 is, for example, a signal having a predetermined duty ratio generated by a clock signal generating circuit or the like.

Figure 1B:
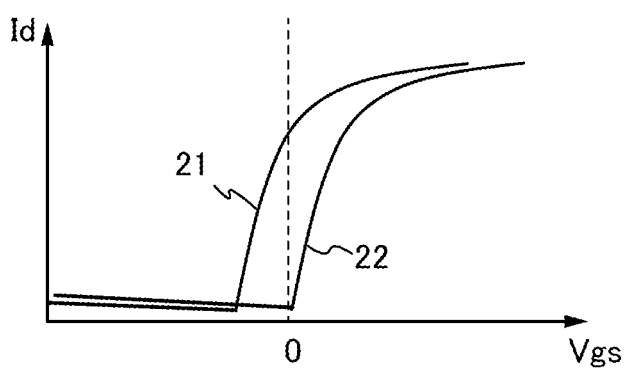

FIG. 1B is a graph showing a relation between a drain current Id of the first transistor 11 and a voltage applied between the gate and the source (gate-source voltage Vgs) of the first transistor 11. A curve 21 in FIG. 1B shows the relation in the case of a normally-on transistor. On the other hand, a curve 22 in FIG. 1B shows the relation in the case of a normally-off transistor.

As described above, the logic circuit 10 has a configuration in which the first gate electrode and the source electrode of the first transistor 11 are connected to each other. Therefore, the voltage applied between the gate and the source (gate-source voltage Vgs) is 0.

In the case where the first transistor 11 is made to switch between a normally-on state and a normally-off state, this switching can be controlled by adjusting the potential of the second gate electrode. That is, the first transistor 11 can be made to switch to a normally-on state by positively shifting the potential of the second gate electrode, and can be made to switch to a normally-off state by negatively shifting the potential of the second gate electrode. Since the first transistor 11 can be made to switch between a normally-on state and a normally-off state by adjusting the potential of the second gate electrode, the amount of the drain current Id at a Vgs of 0 V can be adjusted.

Therefore, with an input signal corresponding to the potential of the second gate electrode, current flowing to the first transistor 11 can be controlled without changing the potential of the first gate electrode from the outside. Accordingly, with the configuration of this embodiment, the potential of the first gate electrode is not changed, which leads to a reduction in power consumption.

Figure 1C:
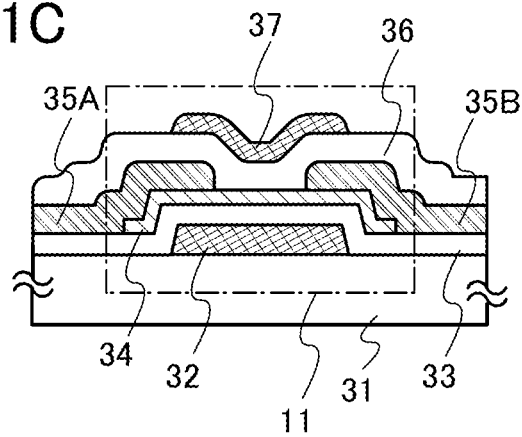

FIG. 1C illustrates an example of a cross-sectional structure of the first transistor 11. The first transistor 11 in FIG. 1C includes a first gate electrode 32 over a substrate 31; a gate insulating film 33 over the first gate electrode 32; a semiconductor film 34 over the gate insulating film 33; a source electrode 35A and a drain electrode 35B which are formed of a conductive film and partly cover the semiconductor film 34; an interlayer insulating film 36 covering the semiconductor film 34, the source electrode 35A, and the drain electrode 35B; and a second gate electrode 37 over the interlayer insulating film 36.

In FIG. 1C, in the case where the semiconductor film 34 includes silicon, an impurity semiconductor film to which phosphorus is added may be formed between the semiconductor film 34, and the source electrode 35A and the drain electrode 35B. Note that when the semiconductor film 34 and each of the source electrode 35A and the drain electrode 35B form an ohmic contact, the impurity semiconductor film is not necessarily formed.

As described above, in this embodiment, in the case where the first transistor 11 is made to switch between a normally-on state and a normally-off state, this switching is controlled by adjusting the potential of the second gate electrode. If a structure is employed in which the first transistor 11 is made to switch between a normally-on state and a normally-off state by adjusting the potential of the first gate electrode 32 in FIG. 1C, the potential of the first gate electrode 32 is applied to a channel formation region in the semiconductor film 34 through the gate insulating film 33 in FIG. 1C. In the case where a sufficient electric field is not applied to the channel formation region in the semiconductor film 34, the first transistor 11 cannot be made to completely switch between a normally-on state and a normally-off state; the thickness of the gate insulating film 33 is difficult to adjust because the gate insulating film 33 is included also in a transistor in another region (e.g., a pixel region). Therefore, the potential of the first gate electrode 32, which is used for making the first transistor 11 switch between a normally-on state and a normally-off state, is made high.

In this embodiment, in the case where the first transistor 11 is made to switch between a normally-on state and a normally-off state, this switching is controlled by adjusting the potential of the second gate electrode 37 illustrated in FIG. 1C. When a structure is employed in which the first transistor 11 is made to switch between a normally-on state and a normally-off state by adjusting the potential of the second gate electrode 37 in FIG. 1C, the potential of the second gate electrode 37 is applied to the channel formation region in the semiconductor film 34 through the interlayer insulating film 36 in FIG. 1C. In the case where a sufficient electric field is not applied to the channel formation region in the semiconductor film 34, the first transistor 11 cannot be made to completely switch between a normally-on state and a normally-off state. However, the thickness of the interlayer insulating film 36 can be easily adjusted even when a transistor is provided in another region (e.g., a pixel region). Therefore, in the case where the potential of the second gate electrode 37 is fixed, the first transistor 11 can be made to switch between a normally-on state and a normally-off state with the thickness of the interlayer insulating film 36 adjusted.

In this manner, the first transistor 11 can be made to switch between a normally-on state and a normally-off state without making the potential of the second gate electrode high. Accordingly, with the configuration of this embodiment, the potential of the second gate electrode is not made high, which leads to a reduction in power consumption.

As described above, according to one embodiment of the present invention, a signal corresponding to an input signal can be output by changing only the potential of the second gate electrode without changing the potential of the first gate electrode while the threshold voltage of the transistor is controlled. Accordingly, power consumption at the time of making the first transistor 11 switch between a normally-on state and a normally-off state can be reduced.

Next, the operation of the logic circuit in FIG. 1A including the first transistor and the second transistor will be described with reference to FIGS. 2A to 2D. In the logic circuit in FIG. 1A, the wiring 13 to which the input signal IN is supplied and the wiring 14 to which the clock signal CLK is supplied are provided as input terminals, and the wiring 15 to which the output signal OUT is supplied is provided as an output terminal. The input signal IN is made to switch between H level and L level, and the clock signal CLK is made to switch between H level and L level; a description is given of each of the cases with reference to FIGS. 2A to 2D.

In FIGS. 2A to 2D, an H-level signal is abbreviated to "H", and an L-level signal is abbreviated to "L".

The first transistor 11 and the second transistor 12 preferably have different current supply capabilities. Specifically, it is preferable that the current supply capability of the second transistor 12 be superior to that of the first transistor 11. By making the current supply capability of the first transistor 11 and that of the second transistor 12 different from each other, the output signal OUT can be surely made at L level when both the first transistor 11 and the second transistor 12 are on.

In order that the current supply capability of the first transistor 11 and that of the second transistor 12 are different from each other, the L/W ratio of the first transistor 11 may be larger than that of the second transistor 12.

Figure 2A:
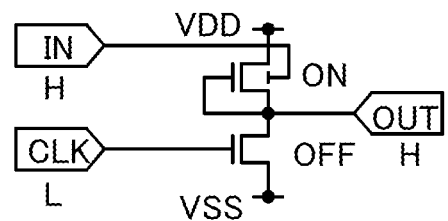
FIGS. 2A to 2D illustrate a structure according to Embodiment 1.

First, the case where the input signal IN is at H level and the clock signal CLK is at L level is described with reference to FIG. 2A. When the input signal IN is at H level, the threshold voltage of the first transistor 11 is negatively shifted; therefore, the first transistor 11 functions as a normally-on transistor, and thus is on. When the clock signal CLK is at L level, the second transistor 12 is off.

Since the first transistor 11 is on and the second transistor 12 is off, the output signal OUT becomes a signal corresponding to the high power supply potential VDD and thus is at H level.

Figure 2B:
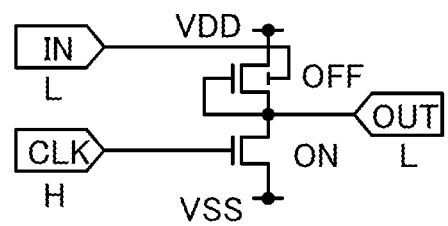

The case where the input signal IN is at L level and the clock signal CLK is at H level is described with reference to FIG. 2B. When the input signal IN is at L level, the threshold voltage of the first transistor 11 is positively shifted; therefore, the first transistor 11 functions as a normally-off transistor, and thus is off. When the clock signal CLK is at H level, the second transistor 12 is on.

Since the first transistor 11 is off and the second transistor 12 is on, the output signal OUT becomes a signal corresponding to the low power supply potential VSS and thus is at L level.

Figure 2C:
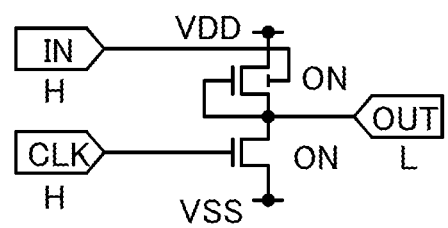

The case where the input signal IN is at H level and the clock signal CLK is at H level is described with reference to FIG. 2C. When the input signal IN is at H level, the threshold voltage of the first transistor 11 is negatively shifted; therefore, the first transistor 11 functions as a normally-on transistor, and thus is on. When the clock signal CLK is at H level, the second transistor 12 is on.

The output signal OUT depends on the current supply capabilities of the first transistor 11 and the second transistor 12; when the first transistor 11 and the second transistor 12 are on, the output signal OUT becomes a signal corresponding to the low power supply potential VSS and thus is at L level as described above.

The case where the input signal IN is at L level and the clock signal CLK is at L level is described with reference to FIG. 2D. When the input signal IN is at L level, the threshold voltage of the first transistor 11 is positively shifted; therefore, the first transistor 11 functions as a normally-off transistor, and thus is off. When the clock signal CLK is at L level, the second transistor 12 is off.

Figure 2D:
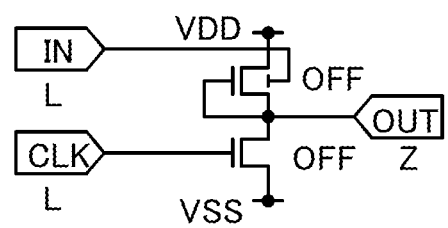

When the first transistor 11 and the second transistor 12 are off, a terminal outputting the output signal OUT is brought into an electrically floating state; thus, the output signal OUT keeps the potential in the preceding period (this state is denoted by "Z" in FIG. 2D).

As described above, according to one embodiment of the present invention, a logic circuit capable of controlling the threshold voltage of a transistor and outputting a signal corresponding to an input signal IN by changing only the potential of a second gate electrode without changing the potential of a first gate electrode can be provided. Accordingly, power consumption at the time of making the transistor switch between a normally-on state and a normally-off state can be reduced.

Next, a configuration of a shift register circuit formed using plural stages of pulse output circuits each including a logic circuit with a first transistor and a second transistor, one example of which is illustrated in FIG. 1A, will be described with reference to FIGS. 3A and 3B. The shift register circuit described in this embodiment includes a transistor functioning as a switch and a plurality of logic circuits.

Figure 3A:
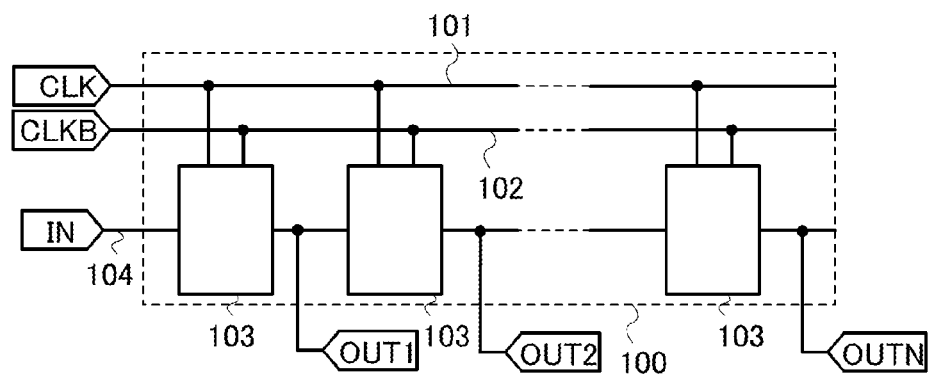
FIGS. 3A and 3B illustrate a structure according to Embodiment 1.

In a shift register circuit 100 in FIG. 3A, a wiring 101 to which a clock signal CLK is supplied, a wiring 102 to which an inverted clock signal CLKB is supplied, pulse output circuits 103 provided in a plurality of stages, and a wiring 104 to which an input signal IN is supplied are provided.

Note that the shift register circuit 100 in FIG. 3A includes N-stage (N is a natural number of 2 or larger) pulse output circuits. Therefore, the shift register circuit 100 in FIG. 3A outputs, as one example, pulse signals OUT1 to OUTN.

Note that the shift register circuit 100 in FIG. 3A may have a configuration in which a signal for changing a scanning direction or the like is additionally input. Although this embodiment shows an example in which the clock signals having two phases, the clock signal (CLK) and the inverted clock signal (CLKB), are used for driving the shift register circuit, another configuration may be employed in which signals other than the clock signals having two phases are input to drive the shift register circuit.

In the case where the shift register circuit in FIG. 3A is provided in a scan line driver circuit, for example, a circuit configuration is employed in which a buffer circuit or the like is connected to each output terminal of the pulse output circuits. Alternatively, in the case where the shift register circuit in FIG. 3A is provided in a signal line driver circuit, for example, a sampling switch for sampling an image signal, a latch circuit, or the like is connected to each output terminal of the pulse output circuits.

For a semiconductor film of each of the transistors in the shift register circuit 100, a semiconductor film containing a semiconductor belonging to Group 14 of the periodic table (e.g., silicon) can be used, for example. In that case, the semiconductor film may be a single crystal semiconductor film, a polycrystalline semiconductor film, a microcrystalline semiconductor film, or an amorphous semiconductor film. Further, for the semiconductor film of the transistor, an oxide semiconductor may be used.

Next, a configuration of the pulse output circuit 103 will be described with reference to FIG. 3B. The pulse output circuit 103 includes, as one example, a first logic circuit 111, a second logic circuit 112, a third logic circuit 113, a fourth logic circuit 114, a first switch 115, a second switch 116, and a third switch 117. In the circuit diagram of FIG. 3B, a block indicated by a dotted line corresponds to the pulse output circuit 103 outputting a pulse signal for one stage.

Figure 3B:
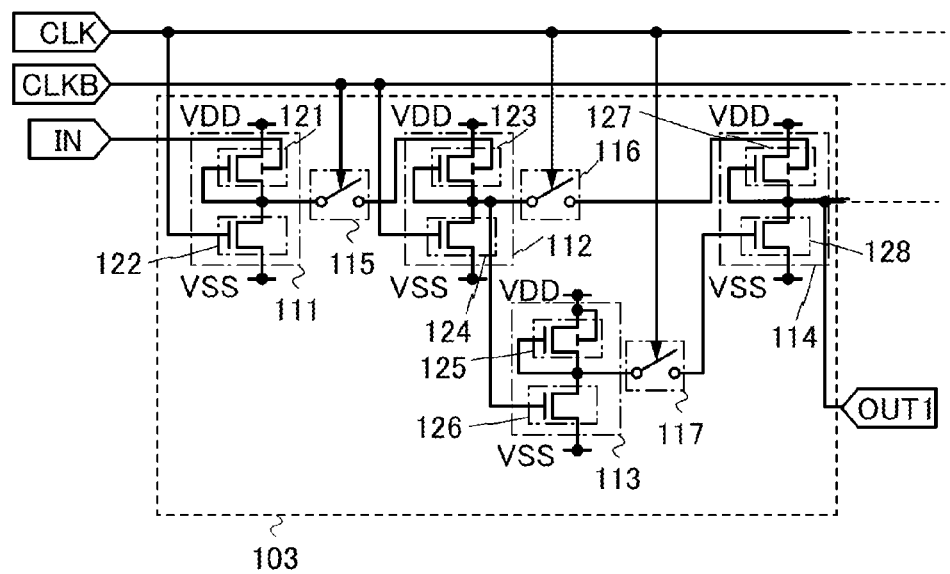

In FIG. 3B, the first logic circuit 111 includes a first transistor 121 and a second transistor 122. The second logic circuit 112 includes a third transistor 123 and a fourth transistor 124. The third logic circuit 113 includes a fifth transistor 125 and a sixth transistor 126. The fourth logic circuit 114 includes a seventh transistor 127 and an eighth transistor 128.

The connection relation in each of the first logic circuit 111, the second logic circuit 112, and the fourth logic circuit 114 in FIG. 3B is the same as that in the logic circuit in FIG. 1A. The connection relation in the third logic circuit 113 is partly different from that in the logic circuit in FIG. 1A.

Specifically, a first gate electrode of the first transistor 121 is connected to a source electrode of the first transistor 121. A second gate electrode of the first transistor 121 is connected to the wiring to which the input signal IN is supplied. A drain electrode of the first transistor 121 is connected to a wiring to which a high power supply potential VDD is supplied. A gate electrode of the second transistor 122 is connected to the wiring to which the clock signal CLK is supplied. A drain electrode of the second transistor 122 is connected to the source electrode of the first transistor 121 and a first terminal of the first switch 115. A source electrode of the second transistor 122 is connected to a wiring to which a low power supply potential VSS is supplied.

A first gate electrode of the third transistor 123 is connected to a source electrode of the third transistor 123. A second gate electrode of the third transistor 123 is connected to a second terminal of the first switch 115. A drain electrode of the third transistor 123 is connected to the wiring to which the high power supply potential VDD is supplied. A gate electrode of the fourth transistor 124 is connected to the wiring to which the inverted clock signal CLKB is supplied. A drain electrode of the fourth transistor 124 is connected to the source electrode of the third transistor 123, a first terminal of the second switch 116, and a gate electrode of the sixth transistor 126. A source electrode of the fourth transistor 124 is connected to the wiring to which the low power supply potential VSS is supplied.

A first gate electrode of the fifth transistor 125 is connected to a source electrode of the fifth transistor 125. A second gate electrode of the fifth transistor 125 is connected to a drain electrode of the fifth transistor 125 and the wiring to which the high power supply potential VDD is supplied. A drain electrode of the sixth transistor 126 is connected to the source electrode of the fifth transistor 125 and a first terminal of the third switch 117. A source electrode of the sixth transistor 126 is connected to the wiring to which the low power supply potential VSS is supplied.

A first gate electrode of the seventh transistor 127 is connected to a source electrode of the seventh transistor 127. A second gate electrode of the seventh transistor 127 is connected to a second terminal of the second switch 116. A drain electrode of the seventh transistor 127 is connected to the wiring to which the high power supply potential VDD is supplied. A gate electrode of the eighth transistor 128 is connected to a second terminal of the third switch 117. A drain electrode of the eighth transistor 128 is connected to the source electrode of the seventh transistor 127 and a wiring to which the output signal OUT1 is supplied. A source electrode of the eighth transistor 128 is connected to the wiring to which the low power supply potential VSS is supplied.

A description is given of the case where transistors functioning as the first switch 115, the second switch 116, and the third switch 117 in FIG. 3B are n-channel transistors. Specifically, the second switch 116 and the third switch 117 are on when the clock signal CLK is at H level, and the first switch 115 is on when the inverted clock signal CLKB is at H level. On the other hand, the second switch 116 and the third switch 117 are off when the clock signal CLK is at L level, and the first switch 115 is off when the inverted clock signal CLKB is at L level.

The on/off state of the first switch 115 is controlled by the potential of the wiring to which the inverted clock signal CLKB is supplied. The on/off state of the second switch 116 is controlled by the potential of the wiring to which the clock signal CLK is supplied. The on/off state of the third switch 117 is controlled by the potential of the wiring to which the clock signal CLK is supplied.

In FIG. 3B, the first logic circuit 111, the second logic circuit 112, and the fourth logic circuit 114 each correspond to the logic circuit in FIG. 1A. Therefore, the shift register circuit includes the logic circuit capable of controlling the threshold voltage of the transistor and outputting a signal corresponding to the input signal IN by changing only the potential of the second gate electrode without changing the potential of the first gate electrode. Accordingly, power consumption at the time of making the transistor switch between a normally-on state and a normally-off state can be reduced.

Next, the operation of the shift register circuit including the pulse output circuit in FIG. 3B will be described with reference to FIGS. 4A and 4B. Note that FIG. 4A is a circuit diagram in which nodes of the pulse output circuit in FIG. 3B are denoted by marks, and FIG. 4B is a timing chart of the shift register circuit.

Figure 4A:
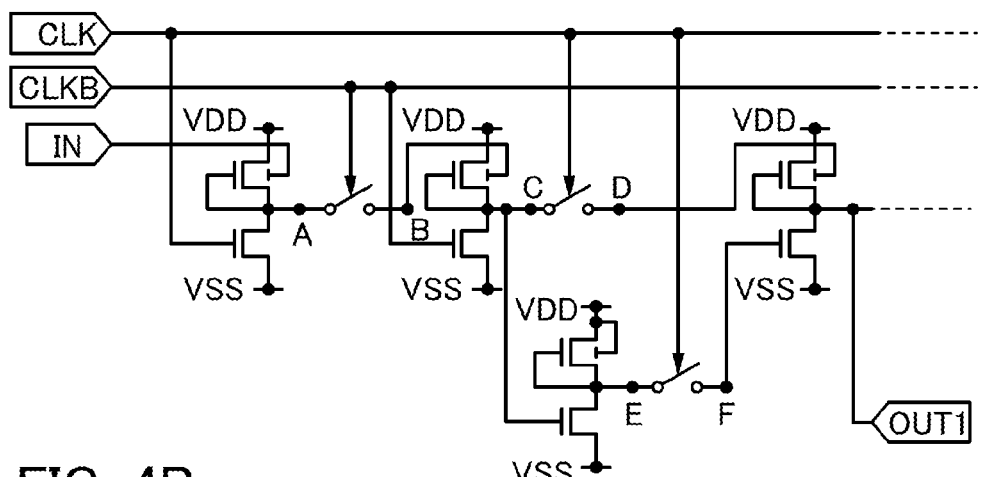
FIGS. 4A and 4B illustrate a structure according to Embodiment 1.

As for the marks denoting the nodes in FIG. 4A, a node A corresponds to the first terminal of the first switch 115; a node B corresponds to the second terminal of the first switch 115; a node C corresponds to the first terminal of the second switch 116; a node D corresponds to the second terminal of the second switch 116; a node E corresponds to the first terminal of the third switch 117; and a node F corresponds to the second terminal of the third switch 117.

Figure 4B:
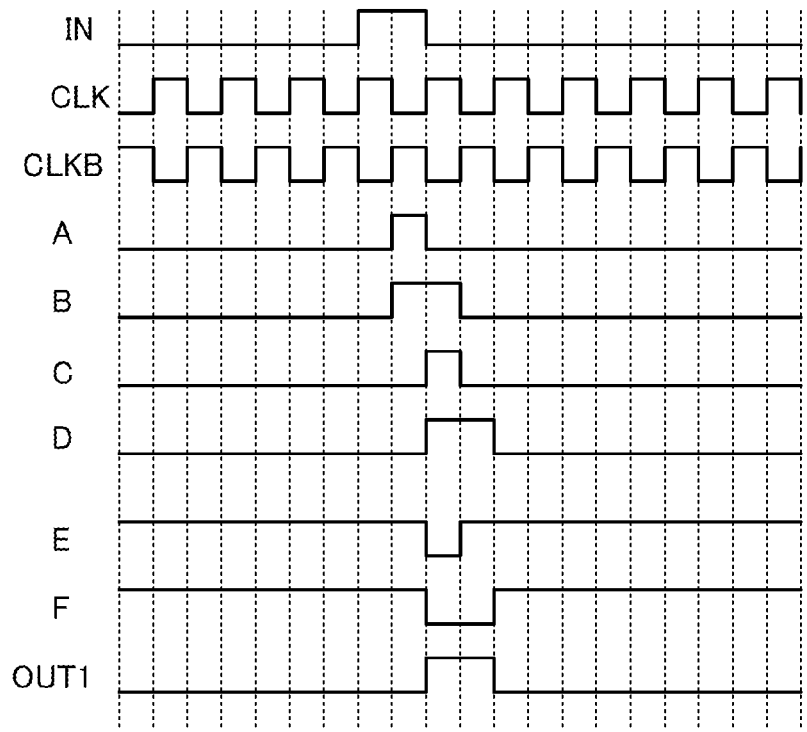

As shown in the timing chart of FIG. 4B, the input signal IN is supplied in the state where the clock signal CLK and the inverted clock signal CLKB are supplied, and the first logic circuit 111 supplies the node A with a signal having such a waveform as is obtained by cutting the first half of the waveform of the input signal W. The node B is supplied with a signal having a waveform shown in FIG. 4B. The second logic circuit 112 supplies the node C with a signal having such a waveform as is obtained by cutting the first half of the waveform of the signal of the node B as shown in the timing chart. The node D is supplied with a signal having a waveform shown in FIG. 4B. The third logic circuit 113 supplies the node E with a signal having such a waveform as is obtained by inverting the signal of the node C as shown in the timing chart. The node F is supplied with a signal having a waveform shown in FIG. 4B. By the fourth logic circuit 114, the output signal OUT1 has such a waveform as is obtained by shifting the waveform of the input signal IN by one wavelength of the clock signal CLK as shown in the timing chart. Note that the waveform of the signal obtained at the node D is the same as the waveform of the output signal OUT1, and it is possible to omit the third logic circuit 113, the fourth logic circuit 114, and the third switch 117.

The shift register circuit described in this embodiment includes the logic circuit capable of controlling the threshold voltage of the transistor and outputting a signal corresponding to the input signal IN by changing only the potential of the second gate electrode without changing the potential of the first gate electrode. Accordingly, power consumption at the time of making the transistor switch between a normally-on state and a normally-off state can be reduced.

This embodiment can be implemented in appropriate combination with any of the structures described in the other embodiments.

Embodiment 2

In this embodiment, a top view and a cross-sectional view of the shift register circuit described in the above embodiment will be described; particularly, a top view and a cross-sectional view of the first transistor and the second transistor included in the logic circuit will be described. Note that a display device including a shift register circuit in this embodiment can be applied to a liquid crystal display device and a display device including a light-emitting element such as an organic EL element. The shift register circuit described in the above embodiment can be employed as a driver circuit of an electronic paper including an electrophoresis element. Note that the shift register circuit described in the above embodiment can be applied to not only a driver circuit of a display device but also other devices such as a driver circuit for a photosensor.

Figure 5:
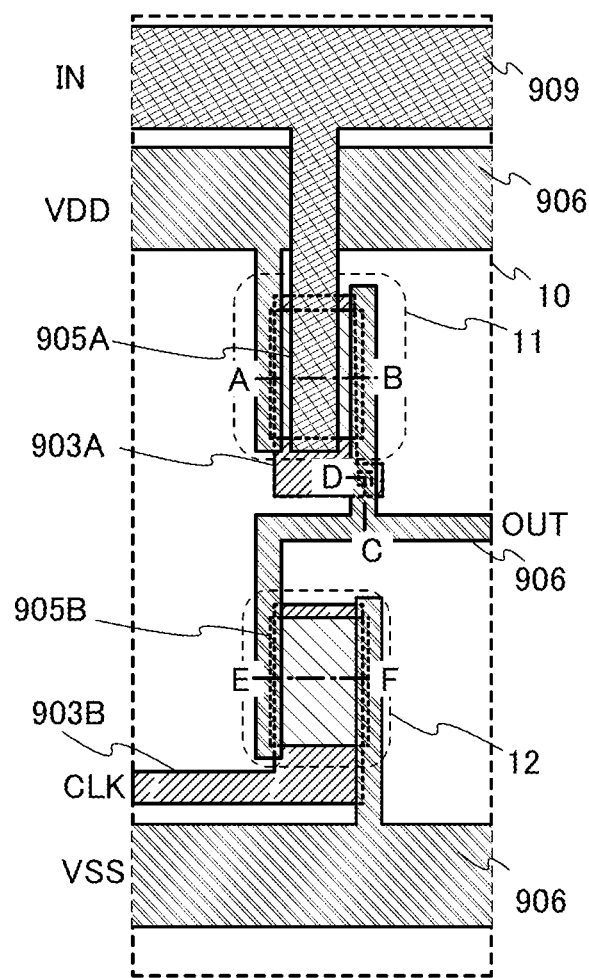
FIG. 5 is an example of a top view of a circuit described in Embodiment 1.
Figure 6:
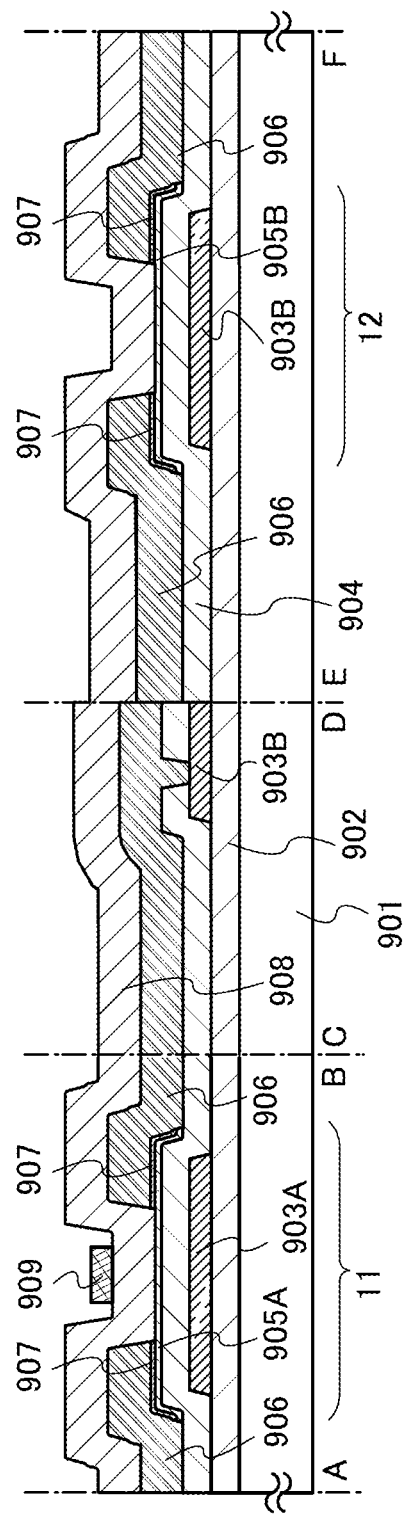
FIG. 6 is an example of a cross-sectional view of a circuit described in Embodiment 1.

FIG. 5 is a top view of the logic circuit 10 including the first transistor 11 and the second transistor 12 described in Embodiment 1 with reference to FIG. 1A. FIG. 6 is a cross-sectional view of the first transistor 11 and the second transistor 12. In addition, the cross-sectional view of the first transistor 11 and the second transistor 12 in FIG. 6 corresponds to sections A-B, C-D, and E-F in the top view of the logic circuit 10 in FIG. 5. Note that in this embodiment, an example of a method of forming a thin film transistor including a semiconductor film of silicon will be particularly described.

First, a base film 902 is formed over a substrate 901. Next, a conductive film is formed over the base film 902, and then gate electrode layers 903A and 903B are formed by a photolithography process.

As the substrate 901, a glass substrate, a ceramic substrate, a plastic substrate with heat resistance, or the like can be used.

The base film 902 has a function of preventing diffusion of an impurity element from the substrate 901, and can be formed with a single-layer structure or a layered structure using one or more of a silicon nitride film, a silicon oxide film, a silicon nitride oxide film, and a silicon oxynitride film.

The conductive film for forming the gate electrode layers 903A and 903B can be formed with a single-layer structure or a layered structure using a metal material such as molybdenum, titanium, chromium, tantalum, tungsten, aluminum, copper, neodymium, scandium, or nickel, or an alloy material which contains any of these materials as a main component.

Then, a gate insulating film 904 is formed over the gate electrode layers 903A and 903B.

The gate insulating film 904 can be formed with a single-layer structure or a layered structure using a silicon oxide layer, a silicon nitride layer, a silicon oxynitride layer, or a silicon nitride oxide layer by a plasma CVD method, a sputtering method, or the like.

Note that here, silicon oxynitride contains more oxygen than nitrogen. In the case where measurements are performed using Rutherford backscattering spectrometry (RBS) and hydrogen forward scattering spectrometry (HFS), silicon oxynitride preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen. In the case where measurements are performed using RBS and HFS, silicon nitride oxide preferably contains oxygen, nitrogen, silicon, and hydrogen at 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Next, the gate insulating film 904 is selectively etched by a photolithography process, so that a contact hole reaching the gate electrode layer 903B is formed.

Then, a semiconductor film is formed over the gate insulating film 904. As a semiconductor that can be applied to the semiconductor film, a semiconductor containing an element belonging to Group 14 of the periodic table (e.g., silicon) can be used. For example, the semiconductor film containing silicon may be a single crystal semiconductor film, a polycrystalline semiconductor film, a microcrystalline semiconductor film, or an amorphous semiconductor film. Note that in the cross-sectional view of FIG. 6, an example of using an amorphous semiconductor film as the semiconductor film is described.

As a semiconductor that can be applied to the semiconductor film, an oxide semiconductor such as a metal oxide may also be used examples of the metal oxide include an In-based oxide (e.g., indium oxide), a Sn-based oxide (e.g., tin oxide), and a Zn-based oxide (e.g., zinc oxide).

Next, an impurity semiconductor film is formed over the semiconductor film. The impurity semiconductor film is formed using amorphous silicon to which phosphorus is added or the like. Note that when a p-channel transistor is used as the transistor, the impurity semiconductor film is formed using amorphous silicon to which boron is added or the like. In the case where the semiconductor film and electrode layers 906 form an ohmic contact, the impurity semiconductor film is not necessarily formed.

Then, by a photolithography process, the semiconductor film and the impurity semiconductor film are processed into an island-shaped semiconductor film 905A, an island-shaped semiconductor film 905B, and island-shaped impurity semiconductor films 907.

Then, a conductive film is formed over the gate insulating film 904, the semiconductor films 905A and 905B, and the impurity semiconductor films 907. After that, a resist mask is formed by a photolithography process, and then selective etching is performed. In this manner, the electrode layers 906 are formed. The conductive film can be formed with a single-layer structure or a layered structure using any of aluminum, copper, titanium, neodymium, scandium, molybdenum, chromium, tantalum, tungsten, and the like.

Next, an insulating layer 908 is formed over the gate insulating film 904, the semiconductor films 905A and 905B, and the electrode layers 906. The insulating layer 908 has a thickness of at least 1 nm, and can be formed in a manner similar to that of the gate insulating film 904. Alternatively, the insulating layer 908 can be formed using an organic resin layer. For the organic resin layer, for example, an acrylic-based resin, an epoxy-based resin, a polyimide-based resin, a polyamide-based resin, a polyvinylphenol-based resin, a benzocyclobutene-based resin, or the like can be used. Alternatively, a siloxane polymer can be used.

Then, a conductive film is formed over the insulating layer 908. After that, a resist mask is formed by a photolithography process, and then selective etching is performed. In this manner, a back gate electrode layer 909 is formed. The conductive film for forming the back gate electrode layer 909 can be formed in a manner similar to that of the conductive film for forming the electrode layers 906. Further, the back gate electrode layer 909 can be formed using indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like.

Through the above process, the first transistor 11 and the second transistor 12 can be manufactured.

This embodiment can be implemented in appropriate combination with any of the structures described in the other embodiments.

Embodiment 3

In this embodiment, an example of providing, over the same substrate, a transistor to be disposed in a pixel portion, and part of a signal line driver circuit and/or a scan line driver circuit including a shift register circuit will be described below.

Figure 7A:
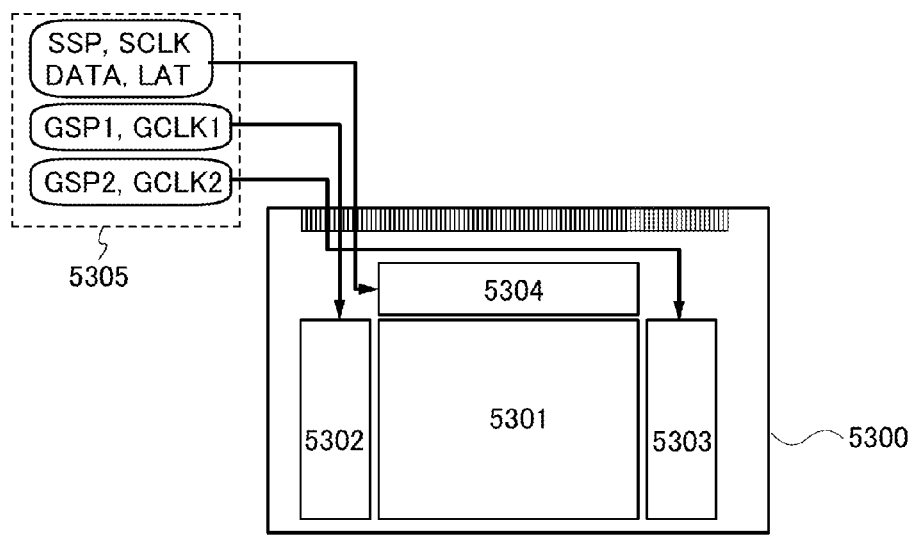
FIGS. 7A and 7B are each a block diagram of a display device including a display portion and a driver circuit portion.

FIG. 7A is an example of a block diagram of an active matrix display device. A pixel portion 5301, a first scan line driver circuit 5302, a second scan line driver circuit 5303, and a signal line driver circuit 5304 are formed over a substrate 5300 of the display device. A plurality of signal lines extended from the signal line driver circuit 5304 and a plurality of scan lines extended from the first scan line driver circuit 5302 and the second scan line driver circuit 5303 are provided in the pixel portion 5301. Note that pixels each including a display element are arranged in a matrix in respective regions where the scan lines and the signal lines intersect with each other. The substrate 5300 of the display device is connected to a timing control circuit 5305 (also referred to as controller or control IC) through a connection portion such as a flexible printed circuit (FPC).

In FIG. 7A, the first scan line driver circuit 5302, the second scan line driver circuit 5303, and the signal line driver circuit 5304 are formed over the same substrate 5300 as the pixel portion 5301. Accordingly, the number of components of a driver circuit and the like provided outside is reduced, so that a reduction in cost can be achieved. Further, if the driver circuit is provided outside the substrate 5300, wirings need to be extended and the number of connections of wirings is increased. However, by providing the driver circuit over the substrate 5300, the number of connections of the wirings can be reduced. Accordingly, an improvement in reliability or an increase in yield can be achieved.

The timing control circuit 5305 supplies, for example, a first scan line driver circuit start signal (GSP1) and a scan line driver circuit clock signal (GCLK1) to the first scan line driver circuit 5302. In addition, the timing control circuit 5305 supplies, for example, a second scan line driver circuit start signal (GSP2) (also referred to as start pulse) and a scan line driver circuit clock signal (GCLK2) to the second scan line driver circuit 5303. The timing control circuit 5305 supplies a signal line driver circuit start signal (SSP), a signal line driver circuit clock signal (SCLK), video signal data (DATA) (also simply referred to as video signal), and a latch signal (LAT) to the signal line driver circuit 5304. Each clock signal may be a plurality of clock signals with shifted phases or may be supplied together with a signal (CLKB) obtained by inverting the clock signal. Note that one of the first scan line driver circuit 5302 and the second scan line driver circuit 5303 can be omitted.

Figure 7B:
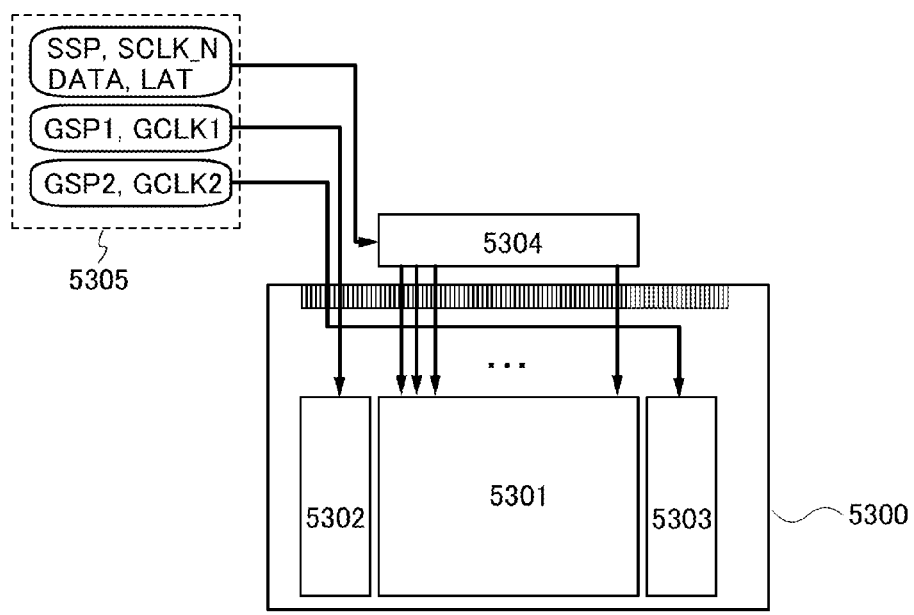

FIG. 7B shows a stricture in which circuits with low driving frequency (e.g., the first scan line driver circuit 5302 and the second scan line driver circuit 5303) are formed over the same substrate 5300 as the pixel portion 5301, and the signal line driver circuit 5304 is formed over a different substrate from the pixel portion 5301. With this structure, the driver circuits including the shift register circuit formed over the substrate 5300 can be constituted by transistors whose field effect mobility is lower than that of transistors including a single crystal semiconductor. Thus, an increase in size of the display device, a reduction in the number of steps, a reduction in cost, an improvement in yield, or the like can be achieved.

In the display device described in this embodiment, the signal line driver circuit and/or the scan line driver circuit including the shift register circuit described in the above embodiment are/is provided. Therefore, the display device described in this embodiment can control the threshold voltage of the transistor and output a signal corresponding to an input signal by changing only the potential of the back gate electrode without changing the potential of the gate electrode.

This embodiment can be implemented in appropriate combination with any of the structures described in the other embodiments.

Embodiment 4

In this embodiment, a description is given of a structure of a light-emitting element included in each pixel in the case where the display device described in the above embodiment is applied to a display device including a light-emitting element such as an organic EL element.

Figure 8:
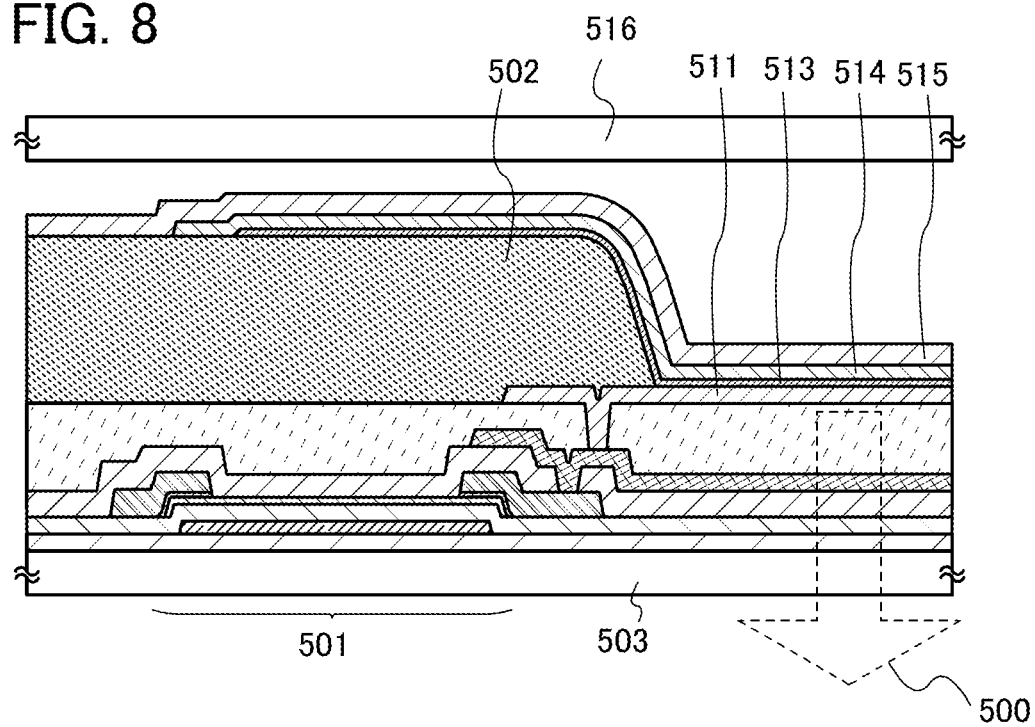
FIG. 8 is an example of a cross-sectional view of a pixel portion.

FIG. 8 illustrates an embodiment of a cross-sectional structure of a light-emitting element connected to a transistor. In the light-emitting element, a first electrode 511, an EL layer 513 including a light-emitting layer, and a second electrode 514 are stacked in that order. One of the first electrode 511 and the second electrode 514 functions as an anode and the other functions as a cathode. Holes injected from the anode and electrons injected from the cathode are recombined in the light-emitting layer included in the EL layer, whereby the light-emitting element emits light. The first electrode 511 of the light-emitting element is connected to a transistor 501 formed over a substrate 503. A partition 502 is provided so as to cover the first electrode 511 and a source electrode or a drain electrode of the transistor 501. The EL layer 513 is provided in an opening in the partition 502 over the first electrode 511. The second electrode 514 is provided so as to cover the EL layer 513 and the partition 502.

The first electrode 511 or the second electrode 514 is formed using a metal, an alloy, or an electrically conductive compound.

For example, the first electrode 511 or the second electrode 514 can be formed using a metal, an alloy, an electrically conductive compound, or the like that has a high work function (a work function of 4.0 eV or more). Specifically, it is possible to use a layer of a light-transmitting conductive metal oxide such as indium oxide-tin oxide (indium tin oxide), indium oxide-tin oxide containing silicon or silicon oxide, indium oxide-zinc oxide (indium zinc oxide), or indium oxide containing tungsten oxide and zinc oxide.

In addition, the first electrode 511 or the second electrode 514 can be formed using a metal, an alloy, an electrically conductive compound, or the like that has a low work function (typically, a work function of 3.8 eV or less). Specifically, any of the following materials can be used, for example: elements that belong to Group 1 or Group 2 of the periodic table (i.e., alkali metals such as lithium and cesium, alkaline-earth metals such as calcium and strontium, and magnesium) and alloys thereof (an alloy of aluminum, magnesium, and silver and an alloy of aluminum and lithium); and rare earth metals (europium and ytterbium) and alloys thereof.

A film of an alkali metal, an alkaline-earth metal, or an alloy thereof is formed by vacuum evaporation, sputtering, or the like. Further, silver paste or the like can be applied by an ink-jet method and baked to form the first electrode 511 or the second electrode 514. The first electrode 511 and the second electrode 514 are not limited to a single-layer structure and can have a layered structure.

In order to extract light emitted from the EL layer 513 to the outside, one of or both the first electrode 511 and the second electrode 514 is/are formed so as to transmit light emitted from the EL layer 513. When only the first electrode 511 has light-transmitting properties, light passes through the first electrode 511 in the direction shown by an arrow 500 and is extracted from the substrate 503 side with a luminance corresponding to a video signal input from a signal line. When only the second electrode 514 has light-transmitting properties, light passes through the second electrode 514 and is extracted from a sealing substrate 516 side with a luminance corresponding to a video signal input from the signal line. When both the first electrode 511 and the second electrode 514 have light-transmitting properties, light passes through the first electrode 511 and the second electrode 514 and is extracted from both the substrate 503 side and the sealing substrate 516 side with a luminance corresponding to a video signal input from the signal line.

For example, the light-transmitting electrode is formed using a light-transmitting conductive metal oxide or formed to a thickness of several nanometers to several tens of nanometers by using silver, aluminum, or the like. Alternatively, the light-transmitting electrode can have a layered structure including a thin layer of metal such as silver or aluminum and a conductive metal oxide layer with light-transmitting properties.

One of the first electrode 511 and the second electrode 514 that serves as the anode is preferably formed using a metal, an alloy, an electrically conductive compound, or the like that has a high work function (a work function of 4.0 eV or more). The other of the first electrode 511 and the second electrode 514 that serves as the cathode is preferably formed using a metal, an alloy, a conductive compound, or the like that has a low work function (a work function of 3.8 eV or less). Typically, the electrode serving as the cathode can be formed using an alkali metal, an alkaline-earth metal, an alloy or a compound containing such a metal, or transition metal (including a rare earth metal in its category).

The EL layer 513 includes the light-emitting layer. The EL layer 513 may include a hole-injection layer, a hole-transport layer, an electron-transport layer, and an electron-injection layer in addition to the light-emitting layer. The hole-transport layer is provided between the anode and the light-emitting layer. The hole-injection layer is provided between the anode and the light-emitting layer or between the anode and the hole-transport layer. The electron-transport layer is provided between the cathode and the light-emitting layer. The electron-injection layer is provided between the cathode and the light-emitting layer or between the cathode and the electron-transport layer. Note that all the hole-injection layer, the hole-transport layer, the electron-transport layer, and the electron-injection layer are not necessarily provided, and a layer to be provided is selected as appropriate depending on a desired function or the like.

The light-emitting layer contains a light-emitting substance. Examples of a light-emitting substance are a fluorescent compound, which exhibits fluorescence, and a phosphorescent compound, which exhibits phosphorescence.

The light-emitting layer, the hole-injection layer, the hole-transport layer, the electron-transport layer, and the electron-injection layer can be formed by evaporation, coating, or the like.

A passivation layer 515 may be formed over the second electrode 514 and the partition 502 by sputtering or CVD. By providing the passivation layer 515, deterioration of the light-emitting element due to entry of moisture and oxygen into the light-emitting element from the outside can be reduced. A space between the passivation layer 515 and the sealing substrate 516 may be filled with nitrogen, and further, a drying agent may be placed. Alternatively, a space between the passivation layer 515 and the sealing substrate 516 may be filled with a light-transmitting organic resin with high water absorbability.

In the case where the light-emitting element emits white light, full-color display can be performed when the substrate 503 or the sealing substrate 516 is provided with a color filter, a color conversion layer, or the like.

In the display device including a light-emitting element such as an organic EL element in this embodiment, the signal line driver circuit and/or the scan line driver circuit including the shift register circuit described in the above embodiment are/is provided. Therefore, the display device including a light-emitting element such as an organic EL element in this embodiment can control the threshold voltage of the transistor and output a signal corresponding to an input signal by changing only the potential of the back gate electrode without changing the potential of the gate electrode.

This embodiment can be implemented in appropriate combination with any of the structures described in the other embodiments.

Embodiment 5

In this embodiment, examples of an electronic device in which the display device in any of the above embodiments is included in a display portion will be described.

The content (or part of the content) described in each drawing in the above embodiments can be applied to a variety of electronic devices, specifically to a display portion of an electronic device. Examples of such electronic devices include television sets (also referred to as televisions or television receivers), monitors of computers or the like, cameras such as digital cameras or digital video cameras, digital photo frames, mobile phone sets (also referred to as mobile phones or mobile phone devices), portable game machines, portable information terminals, audio reproducing devices, large-sized game machines such as pachinko machines, and the like.

Figure 9A:
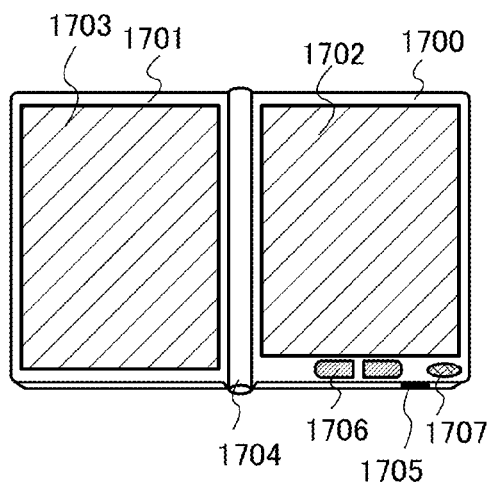
FIGS. 9A to 9D each illustrate an example of an electronic device.

FIG. 9A illustrates an example of an electronic book reader. The electronic book reader illustrated in FIG. 9A includes two housings 1700 and 1701. The housing 1700 and the housing 1701 are combined with a hinge 1704 so that the electronic book reader can be opened and closed. With such a structure, the electronic book reader can be handled like a paper book.

A display portion 1702 and a display portion 1703 are incorporated in the housing 1700 and the housing 1701, respectively. The display portion 1702 and the display portion 1703 may be configured to display one image or different images. In the case where the display portions 1702 and 1703 display different images, the display portion on the right side (the display portion 1702 in FIG. 9A) can display text and the display portion on the left side (the display portion 1703 in FIG. 9A) can display images, for example.

FIG. 9A illustrates an example in which the housing 1700 is provided with an operation portion and the like. For example, the housing 1700 is provided with a power supply input terminal 1705, an operation key 1706, a speaker 1707, and the like. With the operation key 1706, pages can be turned. Note that a keyboard, a pointing device, or the like may be provided on the surface of the housing, on which the display portion is provided. Further, an external connection terminal (e.g., an earphone terminal, a USB terminal, or a terminal that can be connected to various cables such as a USB cable), a recording medium insertion portion, or the like may be provided on the back surface or the side surface of the housing. Furthermore, the electronic book device illustrated in FIG. 9A may have a function of an electronic dictionary.

Figure 9B:
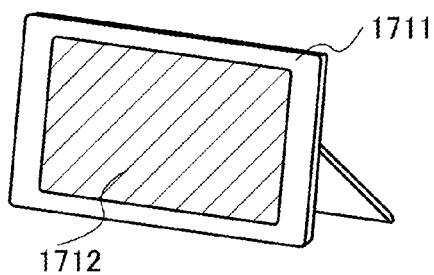

FIG. 9B illustrates an example of a digital photo frame including the EL display device disclosed in this specification. For example, in the digital photo frame illustrated in FIG. 9B, a display portion 1712 is incorporated in a housing 1711. The display portion 1712 can display a variety of images. For example, the display portion 1712 can display an image taken with a digital camera or the like and function as a normal photo frame.

Note that the digital photo frame in FIG. 9B may be provided with an operation portion, an external connection terminal (e.g., a USB terminal or a terminal that can be connected to a variety of cables such as a USB cable), a recording medium insertion portion, and the like. Although these components may be provided on the surface on which the display portion is provided, it is preferable to provide them on the side surface or the back surface for the design of the digital photo frame. For example, a memory that stores an image taken with a digital camera is inserted in the recording medium insertion portion of the digital photo frame, and the image can be transferred and displayed on the display portion 1712.

Figure 9C:
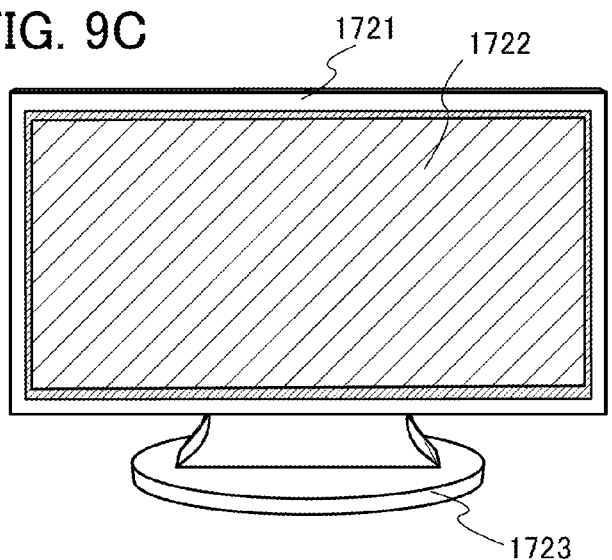

FIG. 9C illustrates an example of a television set including the EL display device. In the television set in FIG. 9C, a display portion 1722 is incorporated in a housing 1721. The display portion 1722 can display images. Further, the housing 1721 is supported by a stand 1723 here. The EL display device described in the above embodiment can be used in the display portion 1722.

The television set illustrated in FIG. 9C can be operated with an operation switch of the housing 1721 or a separate remote controller. With operation keys of the remote controller, channels and volume can be controlled and an image displayed on the display portion 1722 can be controlled. Further, the remote controller may be provided with a display portion for displaying data output from the remote controller.

Figure 9D:
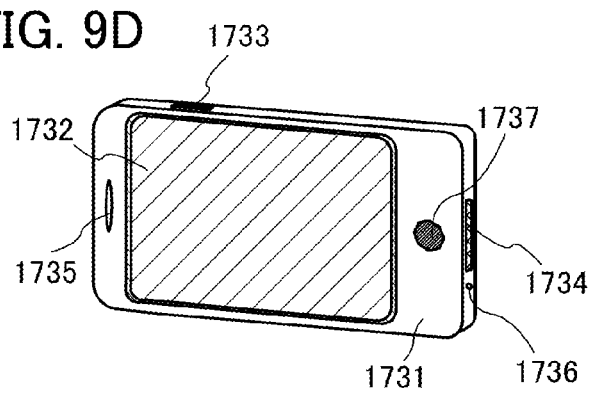

FIG. 9D illustrates an example of a mobile phone including the EL display device disclosed in this specification. The mobile phone in FIG. 9D is provided with a display portion 1732 incorporated in a housing 1731, an operation button 1733, an operation button 1737, an external connection port 1734, a speaker 1735, a microphone 1736, and the like.

The display portion 1732 of the mobile phone in FIG. 9D is a touch panel. By touching the display portion 1732 with a finger or the like, contents displayed on the display portion 1732 can be controlled. Further, operations such as making calls and texting can be performed by touching the display portion 1732 with a finger or the like.

Any of the electronic devices described in this embodiment is an electronic device having a display device including the shift register circuit described in the above embodiment. Therefore, the electronic device described in this embodiment can control the threshold voltage of a transistor and output a signal corresponding to an input signal IN by changing only the potential of a back gate electrode without changing the potential of a gate electrode.

This embodiment can be implemented in appropriate combination with any of the structures described in the other embodiments.

This application is based on Japanese Patent Application serial no. 2011-212048 filed with Japan Patent Office on Sep. 28, 2011, the entire contents of which are hereby incorporated by reference.

What is claimed is:

1. A logic circuit comprising:
  a first transistor having a conductivity type, the first transistor comprising:
    a first gate electrode;
    a source electrode electrically connected to the first gate electrode; and
    a second gate electrode electrically connected to a first wiring;
  a second transistor having the conductivity type, the second transistor comprising a third gate electrode electrically connected to a second wiring, and a drain electrode; and
  a third transistor comprising a fourth gate electrode, the fourth gate electrode electrically connected to a third wiring,
  wherein the source electrode of the first transistor is electrically connected to the drain electrode of the second transistor and one of a source electrode and a drain electrode of the third transistor,
  wherein the second wiring is configured to supply a clock signal, and
  wherein the third wiring is configured to supply an inverted signal of the clock signal.

2. The logic circuit according to claim 1,
  wherein an input signal is supplied to the first wiring.

3. The logic circuit according to claim 1, wherein the first transistor and the second transistor are n-channel transistors.

4. The logic circuit according to claim 1, wherein the first gate electrode and the third gate electrode are formed from a same layer.

5. A shift register circuit comprising the logic circuit according to claim 1.

6. A display device comprising the shift register circuit according to claim 5.

7. An electronic device comprising the display device according to claim 6.

8. A logic circuit comprising:
  a first transistor having a conductivity type, the first transistor comprising:
    a first gate electrode;
    a source electrode electrically connected to the first gate electrode;
    a first semiconductor film over the first gate electrode; and
    a second gate electrode over the first semiconductor film, the second gate electrode being electrically connected to a first wiring;
  a second transistor having the conductivity type, the second transistor comprising:
    a drain electrode;
    a third gate electrode electrically connected to a second wiring; and
    a second semiconductor film over the third gate electrode; and
  a third transistor comprising a fourth electrode, the fourth electrode electrically connected to a third wiring,
  wherein the source electrode of the first transistor is electrically connected to the drain electrode of the second transistor and one of a source electrode and a drain electrode of the third transistor,
  wherein the second wiring is configured to supply a clock signal, and
  wherein the third wiring is configured to supply an inverted signal of the clock signal.

9. The logic circuit according to claim 8,
  wherein an input signal is supplied to the first wiring.

10. The logic circuit according to claim 8, wherein the first transistor and the second transistor are n-channel transistors.

11. The logic circuit according to claim 8, wherein the first semiconductor film and the second semiconductor film are formed from a same layer.

12. The logic circuit according to claim 8, wherein the first semiconductor film and the second semiconductor film are oxide semiconductor films.

13. A shift register circuit comprising the logic circuit according to claim 8.

14. A display device comprising the shift register circuit according to claim 13.

15. An electronic device comprising the display device according to claim 14.

16. A logic circuit comprising:
a first transistor having a conductivity type, the first transistor comprising:
   a first gate electrode;
   a gate insulating film over the first gate electrode;
   a first semiconductor film over the gate insulating film;
   a source electrode and a first drain electrode over the first semiconductor film;
   an interlayer insulating film over the source electrode and the first drain electrode; and
   a second gate electrode over the interlayer insulating film, the second gate electrode being electrically connected to a first wiring;
a second transistor having the conductivity type, the second transistor comprising:
   a second drain electrode;
   a third gate electrode electrically connected to a second wiring;
   the gate insulating film over the third gate electrode; and
   a second semiconductor film over the gate insulating film; and
a third transistor comprising a fourth gate electrode, the fourth gate electrode electrically connected to a third wiring,
wherein the first gate electrode is electrically connected to the source electrode,
wherein the source electrode of the first transistor is electrically connected to the second drain electrode of the second transistor and one of a source electrode and a drain electrode of the third transistor,
wherein the second wiring is configured to supply a clock signal, and
wherein the third wiring is configured to supply an inverted signal of the clock signal.

17. The logic circuit according to claim 16, wherein an input signal is supplied to the first wiring.

18. The logic circuit according to claim 16, wherein the first transistor and the second transistor are n-channel transistors.

19. The logic circuit according to claim 16, wherein a thickness of the gate insulating film is smaller than a thickness of the interlayer insulating film.

20. The logic circuit according to claim 16, wherein the first semiconductor film and the second semiconductor film are formed from a same layer.

21. The logic circuit according to claim 16, wherein the first semiconductor film and the second semiconductor film are oxide semiconductor films.

22. A shift register circuit comprising the logic circuit according to claim 16.

23. A display device comprising the shift register circuit according to claim 22.

24. An electronic device comprising the display device according to claim 23.

25. The logic circuit according to claim 1, wherein a L/W ratio of the first transistor is larger than that of the second transistor.

26. The logic circuit according to claim 8, wherein a L/W ratio of the first transistor is larger than that of the second transistor.

27. The logic circuit according to claim 16, wherein a L/W ratio of the first transistor is larger than that of the second transistor.

* * * * *